(12) United States Patent
Kim

(10) Patent No.: US 11,693,027 B2
(45) Date of Patent: Jul. 4, 2023

(54) CONDUCTIVE PARTICLE AND TESTING SOCKET COMPRISING THE SAME

(71) Applicant: SNOW CO., LTD., Siheung-si (KR)

(72) Inventor: Gyu Sun Kim, Yongin-si (KR)

(73) Assignee: SNOW CO., LTD., Siheung-si (KR)

( * ) Notice: Subject to any disclaimer, the term of this patent is extended or adjusted under 35 U.S.C. 154(b) by 123 days.

(21) Appl. No.: 17/340,841

(22) Filed: Jun. 7, 2021

(65) Prior Publication Data

US 2022/0057434 A1 Feb. 24, 2022

(30) Foreign Application Priority Data

Aug. 21, 2020 (KR) .................... 10-2020-0105157

(51) Int. Cl.
*G01R 1/04* (2006.01)
*G01R 1/16* (2006.01)
*G01R 31/28* (2006.01)

(52) U.S. Cl.
CPC ............. *G01R 1/0466* (2013.01); *G01R 1/16* (2013.01); *G01R 31/2884* (2013.01)

(58) Field of Classification Search
CPC .... G01R 1/0466; G01R 1/16; G01R 31/2884; G01R 1/0441; G01R 1/0416; G01R 31/2863; G01R 31/2879; H01B 7/00
USPC ................... 324/756.02, 756.01, 537, 500
See application file for complete search history.

(56) References Cited

U.S. PATENT DOCUMENTS

| | | | | |
|---|---|---|---|---|
| 6,545,363 B2* | 4/2003 | Maruyama | ........ | H01L 23/49827 257/773 |
| 8,174,279 B2* | 5/2012 | Lee | ..................... | G01R 1/06744 324/754.16 |
| 2006/0154497 A1* | 7/2006 | Amemiya | .......... | G01R 1/07314 439/66 |
| 2011/0043234 A1* | 2/2011 | Lee | ....................... | G01R 1/0466 324/755.09 |
| 2015/0377923 A1* | 12/2015 | Lee | ....................... | G01R 1/0466 324/756.02 |
| 2022/0099730 A1* | 3/2022 | Oh | ....................... | G01R 31/2863 |
| 2022/0252639 A1* | 8/2022 | Shin | ..................... | G01R 1/0416 |
| 2023/0065997 A1* | 3/2023 | Lee | ..................... | G01R 31/2889 |

FOREIGN PATENT DOCUMENTS

| | | |
|---|---|---|
| JP | 2008-108842 A | 5/2008 |
| KR | 10-1525520 B1 | 6/2015 |
| KR | 10-1586340 B1 | 1/2016 |
| KR | 10-1739536 B1 | 5/2017 |
| KR | 10-1739537 B1 | 5/2017 |
| KR | 10-2017-0108521 A | 9/2017 |
| KR | 10-1769882 B1 | 9/2017 |
| KR | 10-1782604 B1 | 9/2017 |
| KR | 10-1901982 B1 | 9/2018 |
| KR | 10-1973609 B1 | 4/2019 |
| TW | I653454 B | 3/2019 |
| TW | 1660178 B | 5/2019 |

* cited by examiner

*Primary Examiner* — Giovanni Astacio-Oquendo
(74) *Attorney, Agent, or Firm* — NKL Law; Jae Youn Kim

(57) ABSTRACT

An embodiment of the present invention provides a conductive particle used for a testing socket electrically connecting a lead of a device to be tested and a pad of a test board by being arranged between the device to be tested and the test board, wherein the conductive particle comprises a plurality of protrusions formed at equal intervals along a circumference.

14 Claims, 9 Drawing Sheets

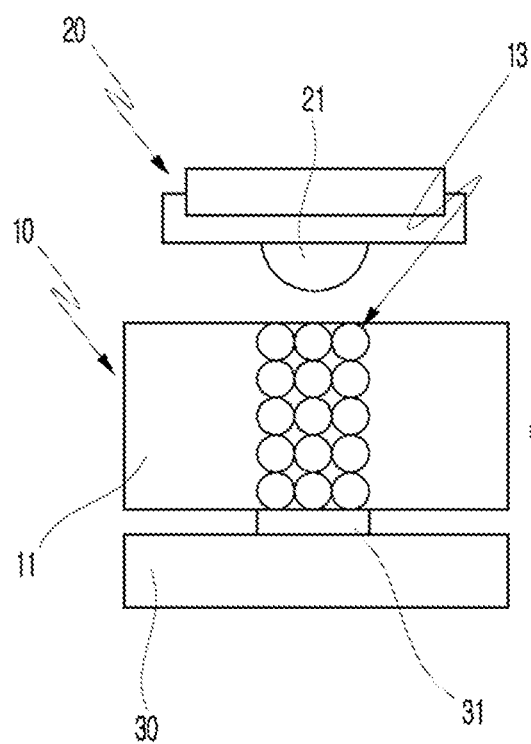
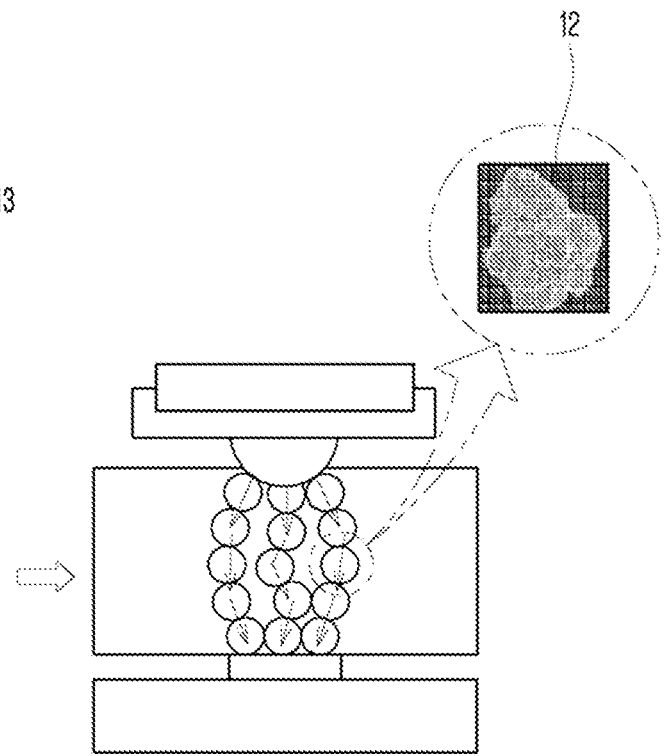
FIG. 1A
PRIOR ART
FIG. 1B
PRIOR ART

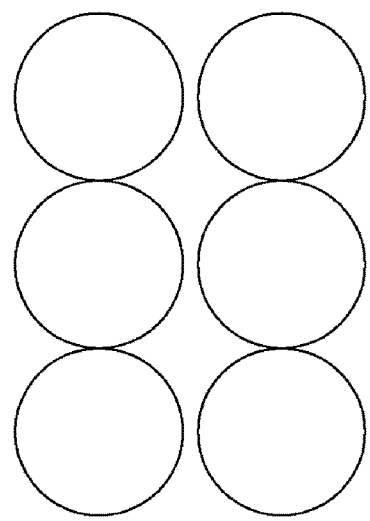 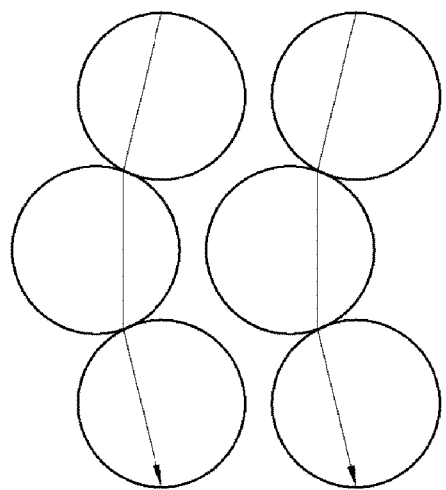 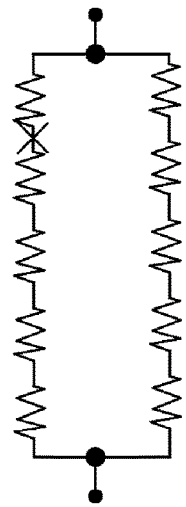
FIG. 9A    FIG. 9B    FIG. 9C
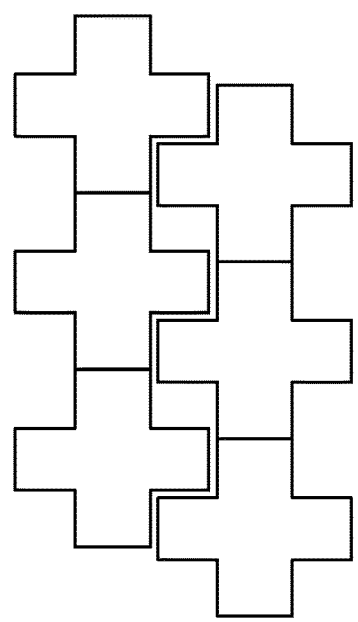 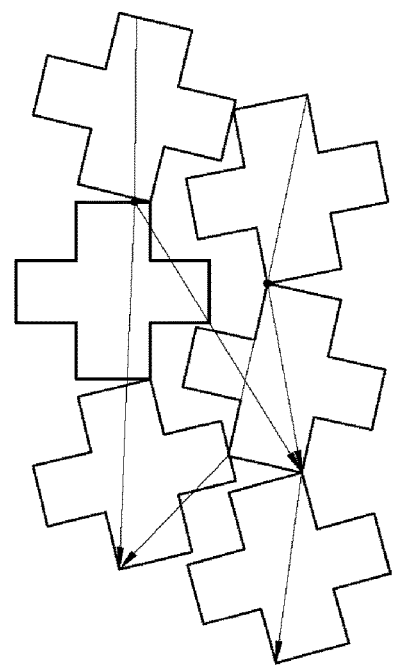 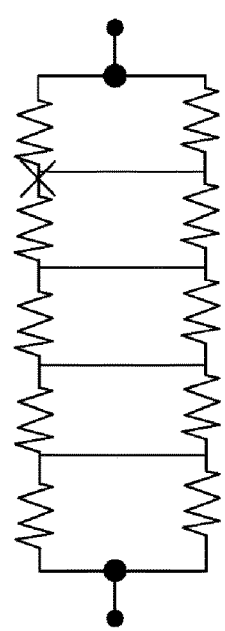
FIG. 10A    FIG. 10B    FIG. 10C

CONDUCTIVE PARTICLE AND TESTING SOCKET COMPRISING THE SAME

CROSS-REFERENCES TO RELATED APPLICATION

This application claims priority to and the benefit of Korean Patent Application No. 10-2020-0105157, filed on Aug. 21, 2020, the disclosure of which is incorporated herein by reference in its entirety.

TECHNICAL FIELD

The present invention relates to a conductive particle and a testing socket comprising the same. More specifically, the present invention relates to a conductive particle and a testing socket electrically connecting a lead of a device to be tested and a pad of a test board by arranging the conductive particle between the device to be tested and the test board.

BACKGROUND ART

In general, when the manufacturing process of a device to be tested such as a semiconductor device is finished, it is necessary to run a test on the device to be tested. In other words, the device to be tested such as a semiconductor device which has been manufactured is subjected to an electric test in order to determine whether the device is defective. Specifically, a predetermined test signal is transmitted from a testing apparatus to the device to be tested to determine whether the device to be tested is defective.

Such testing sockets require a stable mechanical contact ability when individual devices to be tested move to their correct position and accurately and repeatedly contact the socket mounted on a test board, and a stable electrical contact ability to minimize signal distortion at the electrical contact point when transmitting signals.

At this time, the test board and the device to be tested are not directly connected to each other, but indirectly connected using an intermediate device such as a testing socket. Various types of testing sockets may be used such as pogo pins, etc., but recently, the use of testing sockets using elastic sheets with anisotropic properties is increasing due to technology changes in semiconductor devices.

FIG. 1A drawing illustrating contact between a lead of a device to be tested and a conductive portion according to prior art.

The testing socket 10 according to prior art is in a form in which a plurality of conductive particles 12 are contained in the substrate 11 made of an insulating elastic material. The plurality of conductive particles 12 are irregular spherical particles, which are oriented in the thickness direction to form one conductive portion 13, and the conductive portion 13 is arranged in the planar direction to correspond to a lead 21 of the device to be tested 20. Meanwhile, the conductive portion is insulatingly supported by an insulating support 11.

In a state in which the testing socket 10 is mounted on the test board 30, each of the conductive portions 13 is in contact with the pad 31 of the test board 30. Thereafter, as illustrated in FIG. 1B, when the device to be tested 20 is lowered, the leads 21 of the device to be tested 20 come into contact with the respective conductive portions 13 and press the conductive portions 13. Accordingly the conductive particles 12 in the conductive portion 13 get in close contact with each other to form a state which allows current pass. Thereafter, when a predetermined test signal is applied from the test board 30, the test signal is transmitted to the device to be tested 20 via the testing socket 10, and on the other way, a reflected signal from the device to be tested 20 is transmitted to the test board 30 via the testing socket 10.

When pressed in the thickness direction, the testing sockets exhibit conductivity only in the thickness direction. Further, the testing sockets have excellent durability and achieve an electrical connection in a simple way because they do not use a mechanical means such as soldering or springs.

Also, the testing sockets can be connected smoothly because they may absorb mechanical shock or deformation. This allows testing sockets to be widely used for an electrical connection with various test boards such as electric circuit devices.

However, the testing socket according to prior art has the following problems.

First, when the conductive particles are spherical, there is a problem that it is difficult to make a stable electrical connection. In general, an electrical connection is easily made when the contact area is broad. However, as for contact between spherical particles, only point contact is possible, which makes the contact area small. Accordingly, resistance increases, loss increases, and accordingly it is difficult to make a stable connection.

Further, when the conductive particles are spherical, in case only adjacent conductive particles in the same row contact each other and the contact between some of conductive particles are cut off, there is a concern that the total contact resistance may increase rapidly.

In addition, when the conductive particles are spherical, in case the conductive particles are repeatedly pressed due to the limitation in compression range, there is a concern that the conductive particles may be easily separated from the elastic material. In other words, in case the electrode of the device to be tested is repeatedly in contact with the conductive particles in the vertical direction for more than tens of thousands of times, there is a problem that the contact force between the elastic material and the conductive particles may be weakened or the elastic material may be torn. In case the conductive particles are separated from the elastic material as above, the feature transmitting the electric flow is lost, and thus the electrical connection between the electrode and the pad is degraded or lost. In particular, as for spherical particles, the contact area with the adjacent elastic material gets small, and this problem becomes significant.

PRIOR ART DOCUMENT

Patent Document (Patent document 1) Korean Patent No. 10-1782604 (Sep. 21, 2017)

SUMMARY OF INVENTION

Technical Task

The present invention is to solve the problems of the prior art. It is an object of the present invention to provide conductive particles comprising protrusions formed at equal intervals along a circumference and a testing socket comprising the same.

Means for Solving the Task

In order to achieve the above object, an aspect of the present invention provides a conductive particle used for a testing socket electrically connecting a lead of a device to be tested and a pad of a test board by being arranged between the device to be tested and the test board, wherein the conductive particle comprises a plurality of protrusions formed at equal intervals along a circumference.

According to an embodiment, the protrusion may be formed with a first protrusion to a fourth protrusion having a square shape.

According to an embodiment, an end of the protrusion may be formed to be curved.

According to an embodiment, the protrusion may be formed with a first protrusion to a third protrusion having a square shape.

According to an embodiment, an edge of the protrusion may be formed to be curved.

According to an embodiment, the conductive particle may have a predetermined thickness t and a predetermined diameter d, and the thickness t may be 90% or less of the diameter d.

According to an embodiment, the thickness t may be greater than or equal to 10% and less than or equal to 90% of the diameter d.

According to an embodiment, the thickness t may be greater than or equal to 30% and less than or equal to 70% of the diameter d.

According to an embodiment, the thickness t may be greater than or equal to 10 μm and less than or equal to 50 μm.

In order to achieve the above object, the present invention provides a testing socket comprising the conductive particle, which comprises: a conductive portion electrically connecting a lead of a device to be tested and a pad of a test board by being arranged between the device to be tested and the test board; and an insulating portion enclosing the surrounding of the conductive portion to support the conductive portion to be separated from each other, wherein the conductive particle is arranged in the conductive portion to be in contact with each other, and wherein the conductive portion comprises an intermediate layer in which the conductive particle is arranged in the thickness direction of the conductive portion.

According to an embodiment, the intermediate layer may be arranged in the thickness direction of the conductive portion such that the center of the conductive particles is in agreement.

According to an embodiment, the intermediate layer may be arranged in the thickness direction of the conductive portion such that the center of the conductive particles is in disagreement.

In order to achieve the above object, the present invention provides a testing socket comprising the conductive particle, which comprises: a conductive portion electrically connecting a lead of a device to be tested and a pad of a test board by being arranged between the device to be tested and the test board; and an insulating portion enclosing the surrounding of the conductive portion to support the conductive portion to be separated from each other, wherein the conductive particle is arranged in the conductive portion to be in contact with each other, and wherein in a top layer of the conductive portion, the conductive particles in the horizontal direction are coupled to each other, or the conductive particles in the horizontal direction is coupled to the conductive particles in the vertical direction.

According to an embodiment, the conductive portion may comprise an intermediate layer which has the conductive particle and is arranged in the thickness direction of the conductive portion.

According to an embodiment, the conductive particle may be arranged within the conductive portion by a magnetic field.

Effect of Invention

According to an aspect of the present invention, unit contact resistance may be reduced by making physical contact between conductive particles on a surface or a line.

In addition, the contact pad may be deformed or damaged by repeated contacts between the semiconductor lead and the contact pad several thousand times or more. However, according to the present invention, the plurality of particles located in the top of the conductive portion have protrusions, thereby increasing the surface area and accordingly increasing the adhesion area between the conductive particles and the rubber of elastomer. Accordingly, the strength and durability of the contact pad may increase, thereby increasing the number of uses.

In addition, when the conductive particles are formed in a block shape and are arranged in the vertical direction, the rigidity of the conductive portion may be improved.

In addition, as the length of the conductive particle increases compared to the existing particle, the number of conductive particles in one conductive column decreases compared to the number of existing spherical particles when a magnetic field line acts thereon, and the total resistance is lowered, thereby improving the electrical performance of the testing socket.

The effects of the present invention are not limited to the above-mentioned effects, and it should be understood that the effects of the present invention include all effects that could be inferred from the configuration of the invention described in the detailed description of the invention or the appended claims.

BRIEF DESCRIPTION OF DRAWINGS

FIGS. 1A-1B are drawings illustrating contact between a lead of a device to be tested and a conductive portion according to prior art;

FIGS. 9A and 9B illustrate the change in conductive particles when the conventional conductive column is pressed, and FIG. 9C illustrates a circuit diagram of when the contact between some of the conductive particles is cut off in the conventional conductive column; and FIGS. 10A and 10B illustrate the change in conductive particles when the conductive column of the present invention is pressed, and FIG. 10C illustrates a circuit diagram of when the contact between some of the conductive particles is cut off in the conductive column of the present invention.

DETAILED MEANS FOR CARRYING OUT THE INVENTION

Figure 2:
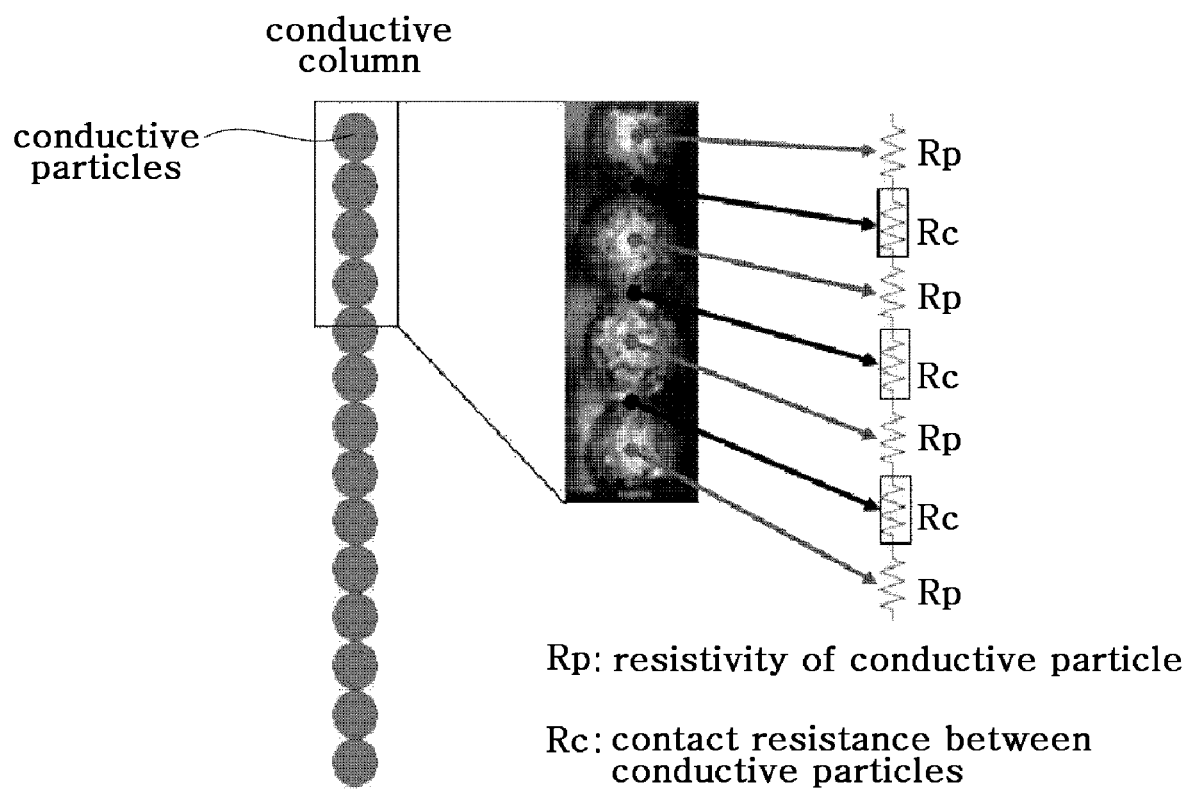
FIG. 2 is a schematic drawing illustrating how the resistance of a conductive portion is determined.

Hereinafter, the present invention will be explained with reference to the accompanying drawings. The present invention, however, may be modified in various different ways, and should not be construed as limited to the embodiments set forth herein. Also, in order to clearly explain the present invention in the drawings, portions that are not related to the present invention are omitted, and like reference numerals are used to refer to like elements throughout the specification.

Throughout the specification, it will be understood that when a portion is referred to as being "connected" to another portion, it can be "directly connected to" the other portion, or "indirectly connected to" the other portion having intervening portions present. Also, when a component "includes" an element, unless there is another opposite description thereto, it should be understood that the component does not exclude another element but may further include another element.

Hereinafter, examples of the present invention will be explained in more detail with reference to the accompanying drawings.

In this regard, a schematic method for determining the resistance of the conductive portion will be described with reference to FIG. 2 as follows.

First, when the individual resistivity of the conductive particles is denoted by $R_P$ and the contact resistance between the conductive particles is denoted by $R_C$, the resistance $R_L$ of the conductive column formed by arranging the conductive particles in the vertical direction is $R_L = \Sigma R_P + \Sigma R_C$ since the respective resistances are connected in series. At this time, $R_L \approx \Sigma R_C$ since the contact resistance $R_C$ between the conductive particles is relatively greater than the individual resistivity $R_P$ of the conductive particles.

In other words, when the size and material of the conductive particles are the same, the resistance of the conductive portion is determined by the contact resistance $R_C$ between the conductive particles. Thus, in order to reduce $R_C$, the present invention aims at increasing physical contact area between the conductive particles and reducing the number of conductive particles in a conductive column.

Figure 3A:
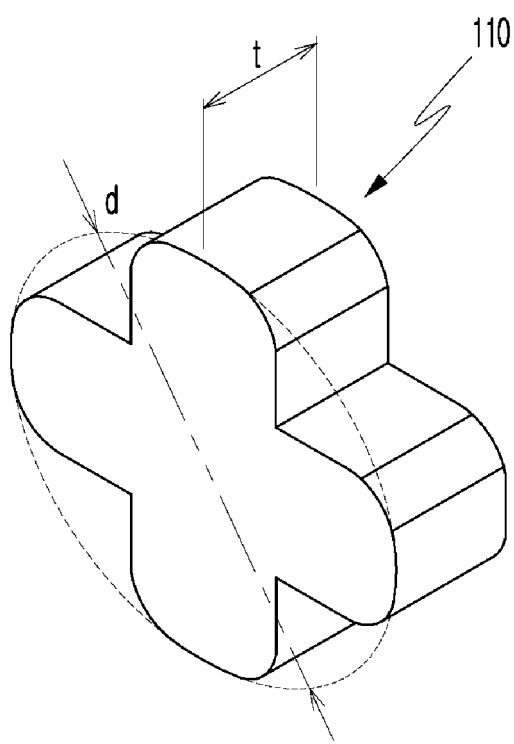
FIGS. 3A-3B are drawings illustrating various embodiments of the conductive particle of the present invention.
Figure 3B:
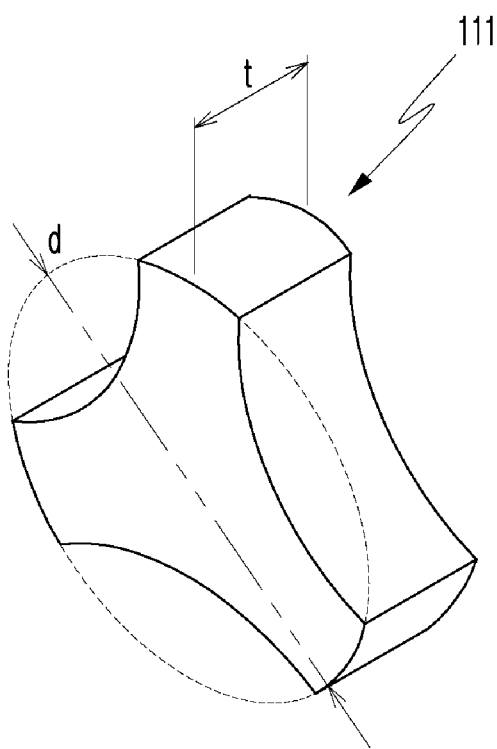

FIGS. 3A-3B are drawings illustrating various embodiments of the conductive particle of the present invention.

Specifically, as illustrated in FIG. 3A-3B, the conductive particle according to an embodiment of the present invention has a predetermined thickness t and a predetermined diameter d, and may be configured to have a plurality of protrusions formed at equal intervals from the center.

When the length and width of the conductive particles are different, or when the protrusions are arranged at different intervals, the conductive particles may be coupled only in a specific direction. In comparison, the protrusions of the conductive particles according to the present invention are formed such that adjacent protrusions are formed at equal intervals along the circumferential direction of a circumference having a diameter d, allowing the protruding shape and the length ratio to be the same so that the conductive particles can be easily coupled to each other regardless of the direction.

That is, when the plurality of protrusions are formed to have rotational symmetry with respect to the center of the conductive particle, physical contact between the conductive particles is made not only on points but also on surfaces or lines so that the unit contact resistance $R_C$ may be reduced.

Preferably, as illustrated in FIG. 3A, the conductive particle 110 (hereinafter, referred to as +-type conductive particle) according to an embodiment of the present invention may be formed with a first protrusion to a fourth protrusion having a square shape. In this case, in order to prevent damage to the silicone rubber enclosing the +-type conductive particle 110, preferably, an end of the protrusion is formed to be curved.

Also, as illustrated in FIG. 3B, the conductive particle 111 (hereinafter, referred to as Y-type conductive particle) according to another embodiment of the present invention may be formed with a first protrusion to a third protrusion having a square shape. In this case, preferably, the edges at both sides of each protrusion are curved toward the inside of the center of the Y-type conductive particle 111 to facilitate the coupling, and the edge at the end of each protrusion is curved toward the outside of the center to prevent damage to the silicone rubber.

More specifically, the thickness t of the conductive particle of the present invention may be formed to be 90% or less of the diameter d. Preferably, the thickness t of the conductive particle may be formed to be greater than or equal to 10% and less than or equal to 90% of the diameter d, and more preferably greater than or equal to 30% and less than or equal to 70% of the diameter d. In this case, when arranged by a magnetic field, the conductive particles may be easily arranged in the vertical direction. In other words, the conductive particles do not rotate randomly with respect to the longitudinal central axis, but are arranged in the vertical direction to facilitate line or surface contact between upper and lower conductive particles.

More preferably, the thickness is greater than or equal to 10 μm and less than or equal to 50 μm so that the contact between the conductive particles may be further expanded.

In addition, in order to reduce the number of conductive particles in the conductive column, preferably the conductive particles are larger in size than the conventional spherical conductive particles. Also, the conductive particles of the present invention are advantageous in being able to increase the size in the same volume compared to the conventional spherical conductive particles.

Figure 4A:
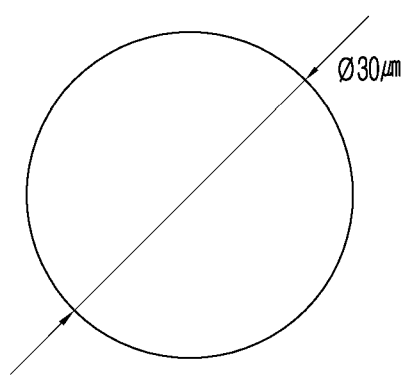
FIG. 4A is a drawing illustrating the conventional spherical conductive particle.
Figure 4B:
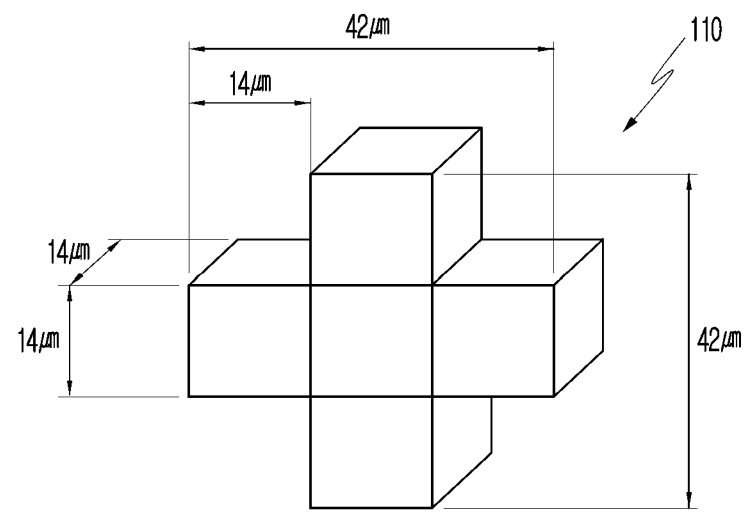
FIG. 4B is a drawing illustrating the conductive particle according to an embodiment of the present invention.

For example, as illustrated in FIG. 4A-4B, assuming a +-type conductive particle having a volume similar to a spherical conductive particle having a diameter of 30 μm, there may be cases where the length and width of each protrusion are about 14 μm and the thickness is 14 μm. At this time, the length of the +-type conductive particle 110 according to an embodiment of the present invention is 42 μm, which is about 1.4 times larger in size than the spherical conductive particles having a diameter of 30 μm. In this regard, when a conductive column is formed by a magnetic field, the number of conductive particles forming a conductive column may be reduced and the contact resistance may be reduced.

Also, the +-type conductive particle 110 according to an embodiment of the present invention has a surface area about 1.5 times larger than the spherical conductive particle, and as will be described later, the adhesion area of the conductive particle and the rubber of elastomer increases as the surface area increases, thereby improving the strength and durability of the contact pad positioned in the top of the conductive portion.

Meanwhile, the protrusions are not limited to the above shape and number, but the effect of increased size and surface area of the conductive particles would decrease as the number of protrusions increases for the same thickness and the same surface area. Therefore, most preferably, the conductive particles have 3 or 4 protrusions as described in the above embodiments.

As conductive particles, particles made of metals exhibiting magnetism such as nickel, iron, cobalt, particles made of alloys thereof, particles containing these metals, or a plating of conductive metal which cannot be oxidized easily such as gold, silver, palladium, rhodium on the surface of the corresponding core particles using these particles as core particles, may be used.

Meanwhile, with regard to the device to be tested 20 such as a semiconductor device, technology development is ongoing in a direction to increase the number of leads 21 and decrease the pitch between the leads 21, and accordingly, the testing socket 1000 is also being manufactured to correspond to this direction of technology development. However, with regard to the testing socket 1000, as the pitch of the lead 21 decreases, the diameter of the conductive portion 100 gets smaller, thereby causing the conductive particles to be smaller. When the conductive particles get smaller, the column of the conductive portion 100 also gets smaller, thereby reducing the elastic section for pressure when contacting the device to be tested 20, which facilitates damage and shortens the lifespan due to non-uniform resistance between the conductive portions 100. In addition, as the diameter of the conductive portion 100 gets smaller, the number of conductive columns 120 decreases, thereby degrading electrical performance such as increasing resistance and decreasing allowable current.

In this regard, the testing socket 1000 according to an embodiment of the present invention comprises a conductive portion 100 electrically connecting a lead 21 of a device to be tested and a pad 31 of a test board 30 by being arranged between the device to be tested and the test board 30; and an insulating portion made of an elastic insulating material, which encloses the surrounding of the conductive portion to support the conductive portion 100 to be separated from each other, wherein the conductive particle of the present invention is arranged in the conductive portion 100 to be in line contact or surface contact with each other by a magnetic field.

Figure 5:
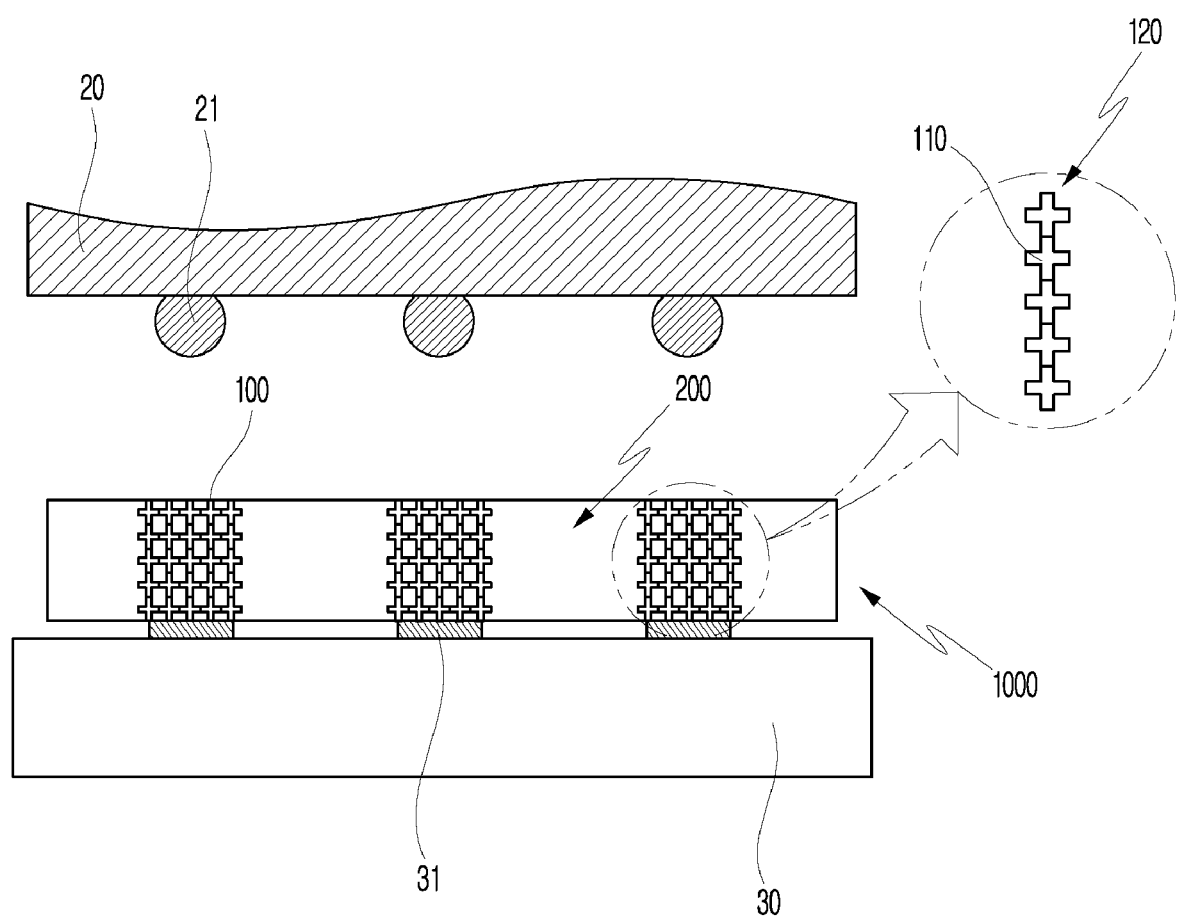
FIG. 5 is a drawing illustrating the testing socket according to an embodiment of the present invention.

In this regard, FIG. 5 is a drawing illustrating the testing socket 1000 according to an embodiment of the present invention.

Specifically, the testing socket 1000 may be in the form of a sheet having a predetermined thickness. At this time, the testing socket 1000 is configured to enable an electrical flow only in the thickness direction, not in the planar direction, thereby electrically connecting the lead 21 of the device to be tested 20 and the pad 31 of the test board 30 in the vertical direction.

Such testing socket 1000 is used to carry out electrical testing of the device to be tested 20, thereby determining whether the device to be tested 20 that is manufactured is defective.

The insulating support 200 forms the body of the testing socket 1000, to support the conductive portion 100 when each conductive portion 100 is under contact load, and block an electrical connection between adjacent conductive portions 100.

More specifically, the insulating support 200 protects each conductive portion 100 by absorbing the contact force when coming into contact with the lead 21 of the device to be tested 20 such as a semiconductor device or the pad 31 of the test board 30.

Preferably, the insulating support 200 is made of an insulating polymer material having a crosslinked structure. More specifically, as the insulating polymer material, conjugated diene rubbers such as polybutadiene rubber, natural rubber, polyisoprene rubber, styrene-butadiene copolymer rubber, acrylonitrile-butadiene copolymer rubber and hydrogenated additives thereof, block copolymer rubbers such as styrene-butadiene-diene block copolymer rubber, styrene-isoprene block copolymer and hydrogenated additives thereof, chloroprene, urethane rubber, polyester rubber, epichlorohydrin rubber, silicone rubber, ethylene-propylene copolymer rubber, ethylene-propylene-diene copolymer rubber, etc. may be used. In particular, it is preferable to use silicone rubber in view of molding processability and electrical properties.

As such silicone rubber, preferably, a liquid silicone rubber is crosslinked or condensed. Preferably, the viscosity of the liquid silicone rubber is greater than or equal to $10^{-1}$ pores and less than or equal to $10^5$ pores in terms of shear rate, and the silicone rubber may be any one of a condensation type, an addition type, or a type containing a vinyl group and a hydroxyl group. Specifically, the silicone rubber may be dimethyl silicone raw rubber, methyl vinyl silicone raw rubber, methylphenyl vinyl silicone raw rubber, etc.

The conductive portion 100 extends in the thickness direction and is compressed when pressed in the thickness direction to enable an electrical flow in the thickness direction, and each conductive portion 100 is arranged to be spaced apart from each other in the planar direction. An insulating support 200 having an insulating property is arranged between the conductive portions 100 to cut off the electrical flow between the conductive portions 100.

The conductive portion 100 is configured such that its upper end can contact the lead 21 of the device to be tested 20 and its lower end can contact the pad 31 of the test board 30. A plurality of conductive particles 110 are formed between the upper and lower ends of the conductive portion 100 so that the conductive particles are oriented vertically in the elastic insulating material. When the conductive portion 100 is pressed by the device to be tested 20, the plurality of conductive particles 110 contact each other and carry out the role enabling an electrical connection.

That is, before being pressed by the device to be tested 20, the conductive particles 110 are slightly spaced apart or in weak contact, and when the conductive portion 100 is pressed and compressed, the conductive particles 110 strongly contact each other, thereby enabling an electrical connection.

Specifically, the conductive portion 100 has a form in which a plurality of conductive particles 110 are densely arranged in an elastic insulating material in the vertical direction, and each conductive portion 100 is arranged in a position approximately corresponding to the lead 21 of the device to be tested 20.

At this time, when a magnetic force line acts on the conductive portion 100, each conductive particle 110 is arranged in the elastic insulating material by a magnetic field, and forms a conductive column 120 extending in the vertical direction. That is, the conductive portion 100 is configured to have a structure in which a plurality of conductive columns 120 are arranged in parallel.

Figures 6A, 6B, 6C, 6D, 6E:
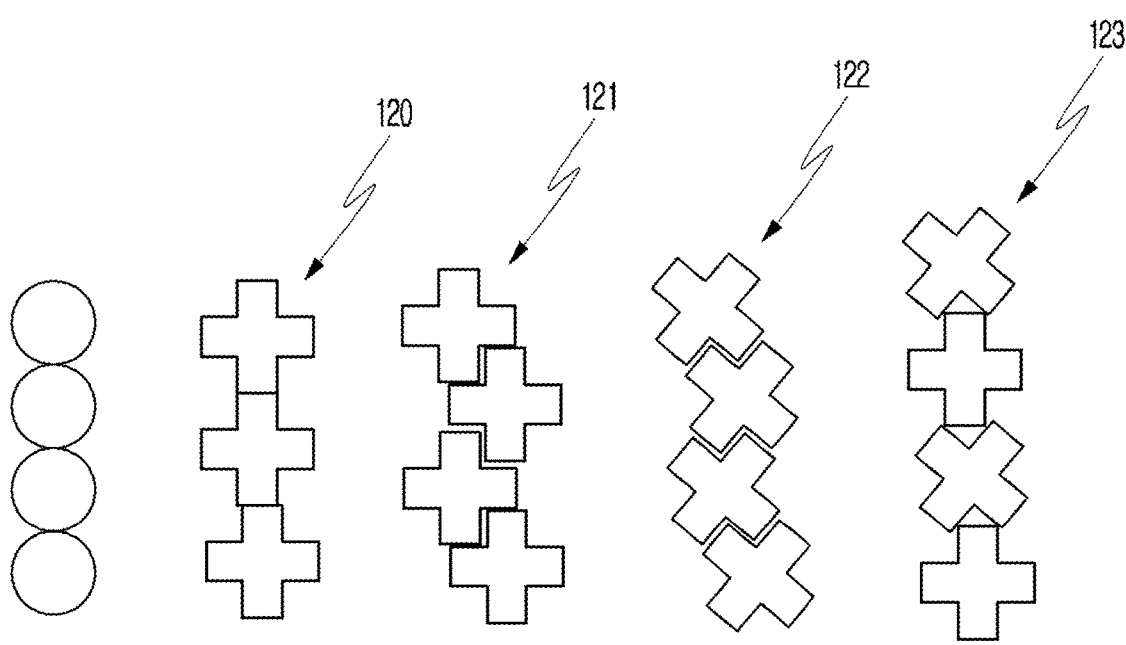
FIG. 6A is a drawing illustrating the conventional conductive column.
FIGS. 6B to 6E are drawings illustrating various embodiments of the conductive column of the present invention.

In this regard, FIG. 6A is a drawing illustrating the conventional conductive column, and FIGS. 6B to 6E are drawings illustrating various embodiments of the conductive column 120 of the present invention.

Specifically, as illustrated in FIG. 6A, the conventional conductive particles are spherical, and thus when arranged in the elastic insulating material by a magnetic field, the spherical conductive particles are arranged vertically while maintaining a one-point contact with adjacent spherical conductive particles.

On the other hand, the conductive particle of the present invention has a plurality of protrusions, and thus when arranged vertically by a magnetic field, the conductive particles make not only point-contact, but also line-contact or surface-contact. Specifically, as illustrated in FIG. 6B, in the case of conductive columns 120 which are arranged in a line in which the center of each of the +-type conductive particles 110 is in agreement, adjacent protrusions make surface contact. In addition, as illustrated in FIG. 6E, the conductive column 123 in which each protrusion of the +-type conductive particle 110 is coupled between the protrusions of the adjacent +-type conductive particles 110 is in line contact with adjacent protrusions.

Meanwhile, in the above-described conductive columns 120 and 123 of the present invention, the center of each of the conductive particles 110 may be arranged in the thickness direction of the conductive portion to be in agreement with each other. However, the present invention is not limited thereto, and the center may be arranged in the thickness direction of the conductive portion to be in disagreement with each other. Specifically, as the conductive columns 121 and 122 illustrated in FIGS. 6C and 6D, each of the +-type conductive particles 110 may be in surface contact with the protrusions of adjacent conductive particles.

As such, the conductive particles of the present invention have protrusions, and thus when forming conductive columns 120, 121, 122, and 123, adjacent conductive particles may make line contact or surface contact, thereby reducing the overall contact resistance $R_C$.

The conductive column of the present invention is not limited to the embodiments of FIGS. 6B to 6E described in the above, and it would be sufficient if the protrusions of each of the conductive particles are in contact with each other while arranging the conductive particles of the present invention.

Meanwhile, as described above, the conductive particles of the present invention are 1.3 to 1.5 times larger in size than the conventional spherical conductive particles. Thus, when the thickness of the insulating support is the same, the number of contact points of the conductive particles in the thickness direction is reduced by about 30 to 50%, and thus the overall contact resistance $R_C$ is reduced.

Figure 7A:
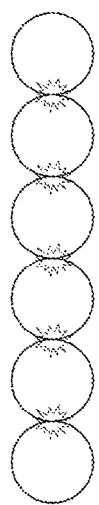
FIG. 7A is a drawing illustrating contact between conventional conductive particles.
Figure 7B:
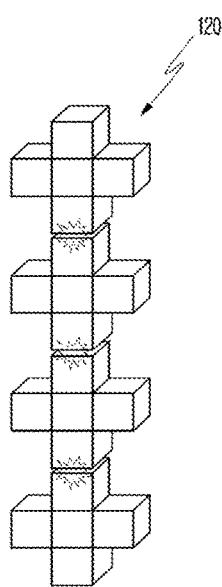
FIGS. 7B to 7E are drawings illustrating contact between the conductive particles of the present invention.
Figure 7C:
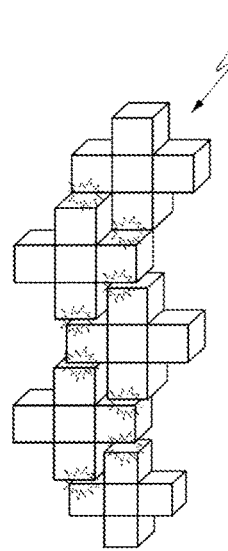
Figure 7D:
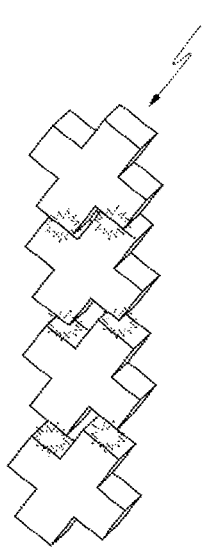
Figure 7E:
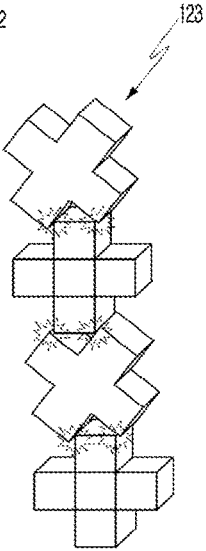

Specifically, as illustrated in FIGS. 7A and 7B, when six spherical conductive particles are arranged, four conductive particles of the present invention may be arranged. In this case, the spherical conductive particles have five contact points, whereas the conductive particles of the present invention have three contact points. Thus, as the number of contact points is reduced, the overall resistance may be reduced as well. Also, as illustrated in FIGS. 7C to 7E, the resistance by contact is connected in series and parallel, and thus the overall resistance may be reduced.

Preferably, the conductive particles may be arranged in the thickness direction of the conductive portion such that the centers thereof are in agreement with each other. In this case, since the contact resistance $R_C$ is arranged in series and parallel, the overall resistance $R_C$ may be reduced by 60% or more compared to the spherical conductive particles in which the contact resistance $R_C$ is arranged in series.

However, the present invention is not limited thereto, and the conductive particles may be arranged in the thickness direction of the conductive portion such that the centers thereof are in disagreement with each other as described above.

Meanwhile, conventionally, spherical conductive particles provided in the top layer x of the conductive portion are arranged in the vertical direction and are in point contact but cannot be coupled with each other. Therefore, when the conductive particles are pressed by the lead 21 of the device to be tested 20, electrical and mechanical properties may deteriorate upon receiving a concentrated load. In addition, since the spherical conductive particles have a smaller surface area compared to volume, adhesion with silicone rubber in which the conductive particles are arranged is weak, and thus, when pressed by the lead 21 of the device to be tested 20, the conductive particles may be separated or sunken.

Figure 8A:
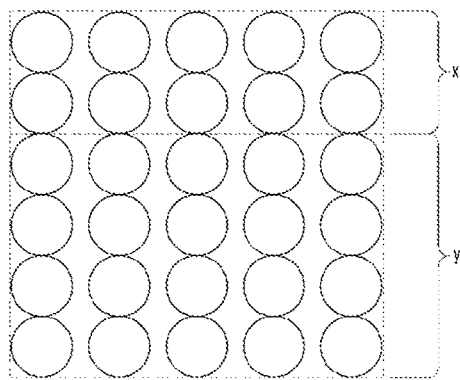
FIG. 8A is a drawing illustrating the conventional conductive portion.
Figure 8B:
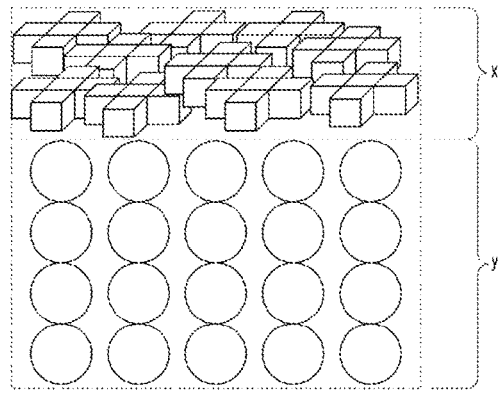
FIGS. 8B to 8D are drawings illustrating various embodiments of the conductive portion of the present invention.
Figure 8C:
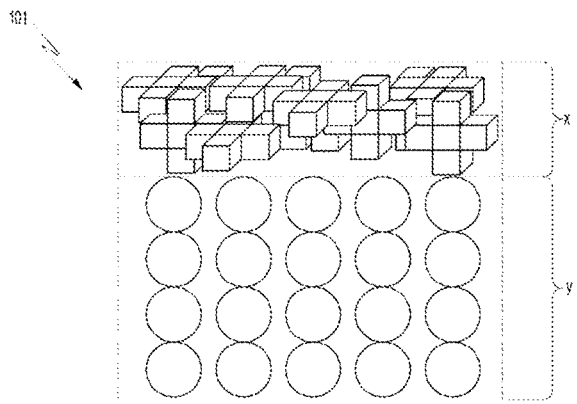
Figure 8D:
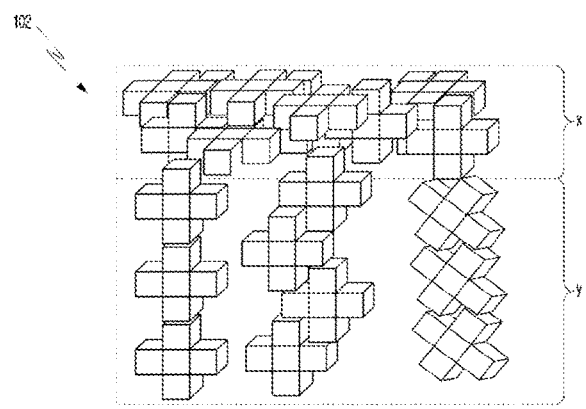

In this regard, FIG. 8A is a drawing illustrating the conventional conductive portion, and FIGS. 8B to 8D are drawings illustrating various embodiments of the conductive portions 100, 101, and 102 of the present invention. As illustrated in FIG. 8A, spherical conductive particles are arranged vertically in the intermediate layer y and the top layer x of the conductive portion of the conventional testing socket 1000.

In comparison, the conductive particles of the present invention may be coupled with each other in the top layer x of the conductive portions 100, 101, and 102 of the testing socket 1000 according to an embodiment of the present invention. Specifically, as in the conductive portion 100 illustrated in FIG. 8B, each of +-type conductive particles 110 may be coupled horizontally by making surface contact between the protrusions. In addition, as in the conductive portion 101 illustrated in FIG. 8C, the +-type conductive particles 110 in the horizontal direction and the +-type conductive particles 110 in the vertical direction may be coupled.

In this case, even if the conductive particles are pressed by the lead 21 of the device 20, adjacent +-type conductive particles 110 are coupled to each other, thereby improving the strength. Also, the physical contact area for line contact or surface contact is enlarged, thereby lowering the unit contact pressure and relieving the impact transmitted to maintain the inherent electrical and mechanical properties for a long time.

In addition, as described above, the surface area of the conductive particles of the present invention is increased by 1.5 times or more compared to the sphere of the same volume, and thus the adhesion area between the conductive particles and the silicone rubber is increased by 50% or more.

Accordingly, when the conductive particles of the present invention are coupled in the top layer x of the conductive portions 100 and 101 as illustrated in FIGS. 8B and 8C, the surface area in contact with the elastic insulating material is larger than the surface area of the conventional spherical conductive particles. Therefore, the conductive particles of the present invention are strongly adhered to the insulating support 200, so that they are less likely to be separated from the insulating support 200 even during a repeated test process, thereby improving durability.

More preferably, in the intermediate layer y of the conductive portion 102, conductive particles may be in surface contact or line contact with adjacent protrusions, as in the embodiments of conductive columns 120, 121, 122, and 123 of the present invention described above, and may be arranged in the thickness direction. In this case, the surface area of each conductive particle is enlarged, so that the conductive particles are less likely to be separated from the insulating support 200, thereby improving durability. In addition, since the size of the conductive particles is 1.3 to 1.5 times or more larger than the conventional spherical conductive particles, when the thickness of the insulating support 200 is the same, the number of contact points of the conductive particles in the thickness direction is reduced by about 30 to 50%, and thus there may be an effect such that the overall resistance $R_C$ is reduced.

Meanwhile, according to the conductive particles according to an embodiment of the present invention, even if the contact of some of the conductive particles in the conductive column is cut off, they are in contact with adjacent conductive particles by the protrusions, and thus the resistance does not increase rapidly as compared to the conventional conductive particles.

Specifically, as illustrated in FIGS. 9 and 10, for example, if the contact resistance $R_C$ between the conductive particles is 1Ω and the conductive portion has two rows, and heat contact is maintained, the total contact resistance $R_C$ is 2.5Ω for both the spherical conductive particles and the conductive particles according to an embodiment of the present invention. However, when the contact of some conductive particles in row one is cut off, the total resistance rapidly increases to 5Ω in the case of the spherical conductive particles, whereas the total resistance is 3Ω in the case of the conductive particles according to an embodiment of the present invention. Therefore, the conductive particles according to an embodiment of the present invention have an advantage that the resistance does not increase rapidly as compared to the conventional spherical conductive particles.

The foregoing description of the present invention has been presented for illustrative purposes, and it is apparent to a person having ordinary skill in the art that the present invention can be easily modified into other detailed forms without changing the technical idea or essential features of the present invention. Therefore, it should be understood that the forgoing embodiments are by way of example only, and are not intended to limit the present disclosure. For example, each component which has been described as a unitary part can be implemented as distributed parts. Likewise, each component which has been described as distributed parts can also be implemented as a combined part.

The scope of the present invention is presented by the accompanying claims, and it should be understood that all changes or m modifications derived from the definitions and scopes of the claims and their equivalents fall within the scope of the present invention.

DESCRIPTION OF REFERENCE NUMERALS

1000: testing socket
100, 101, 102: conductive portion
110, 111: conductive particle
120, 121, 122, 123: conductive column
200: insulating support
20: device to be tested
21: lead
30: test board
31: pad
x: top layer
y: intermediate layer
$R_P$: resistivity of conductive particle
$R_C$: contact resistance between conductive particles
$R_L$: resistance of conductive column

What is claimed is:

1. A conductive particle used for a testing socket electrically connecting a lead of a device to be tested and a pad of a test board by being arranged between the device to be tested and the test board, the conductive particle comprising:
    a center; and
    first to fourth protrusions each having a square shape protruding in a radial direction from a side surface of the center,
    wherein the conductive particle has a predetermined thickness t and a predetermined diameter d, and
    wherein the first to the fourth protrusions are arranged at equal intervals along a circumferential direction of a circumference having the predetermined diameter d with respect to the center.

2. The conductive particle of claim 1, wherein an end of one or more of the first to the fourth protrusions is formed to be curved.

3. The conductive particle of claim 1, wherein the predetermined thickness t is 90% or less of the predetermined diameter d.

4. The conductive particle of claim 3, wherein the predetermined thickness t is greater than or equal to 10% and less than or equal to 90% of the predetermined diameter d.

5. The conductive particle of claim 4, wherein the predetermined thickness t is greater than or equal to 30% and less than or equal to 70% of the predetermined diameter d.

6. The conductive particle of claim 4, wherein the predetermined thickness t is greater than or equal to 10 μm and less than or equal to 50 μm.

7. A testing socket comprising the conductive particle of claim 1, comprising:
    a conductive portion electrically connecting a lead of a device to be tested and a pad of a test board by being arranged between the device to be tested and the test board; and
    an insulating portion enclosing the surrounding of the conductive portion to support the conductive portion to be separated from each other,
    wherein the conductive particle is arranged in the conductive portion to be in contact with each other, and
    wherein the conductive portion comprises an intermediate layer in which the conductive particle is arranged in the thickness direction of the conductive portion.

8. The testing socket of claim 7, wherein the intermediate layer is arranged in the thickness direction of the conductive portion such that the center of the conductive particles is in agreement.

9. The testing socket of claim 7, wherein the intermediate layer is arranged in the thickness direction of the conductive portion such that the center of the conductive particles is in disagreement.

10. A testing socket comprising the conductive particle of claim 1, comprising:
    a conductive portion electrically connecting a lead of a device to be tested and a pad of a test board by being arranged between the device to be tested and the test board; and
    an insulating portion enclosing the surrounding of the conductive portion to support the conductive portion to be separated from each other,
    wherein the conductive particle is arranged in the conductive portion to be in contact with each other, and
    wherein in a top layer of the conductive portion, the conductive particles in the horizontal direction are coupled to each other, or the conductive particles in the horizontal direction are coupled to the conductive particles in the vertical direction.

11. The testing socket of claim 10, wherein the conductive portion comprises an intermediate layer which has the conductive particle and is arranged in the thickness direction of the conductive portion.

12. The testing socket of claim 10, wherein the conductive particle is arranged within the conductive portion by a magnetic field.

13. A conductive particle used for a testing socket electrically connecting a lead of a device to be tested and a pad of a test board by being arranged between the device to be tested and the test board, the conductive particle comprising:
   a center; and
   first to third protrusions each having a square shape protruding in a radial direction from a side surface of the center,
   wherein the conductive particle has a predetermined thickness t and a predetermined diameter d, and
   wherein the first to the third protrusions are arranged at equal intervals along a circumferential direction of a circumference having the predetermined diameter d with respect to the center.

14. The conductive particle of claim 13, wherein an edge of one or more of the first to the third protrusions is formed to be curved.

* * * * *